United States Patent [19]

Ide

[11] Patent Number: 4,623,845
[45] Date of Patent: Nov. 18, 1986

[54] MULTI-CLOCK GENERATOR

[75] Inventor: Keiichiro Ide, Gyoda, Japan

[73] Assignee: Takeda Riken Kogyo Kabushikikaisha, Tokyo, Japan

[21] Appl. No.: 700,905

[22] Filed: Feb. 12, 1985

[30] Foreign Application Priority Data

Feb. 15, 1984 [JP] Japan ................................. 59-27644

[51] Int. Cl.[4] ........................ H03K 5/15; H03K 5/156; H03K 3/78
[52] U.S. Cl. ........................................ 328/60; 328/62; 328/63; 307/269; 377/19
[58] Field of Search .................... 307/269; 328/60, 61, 328/62, 63; 377/19, 20

[56] References Cited

U.S. PATENT DOCUMENTS

| 4,165,490 | 8/1979 | Howe et al. | 328/60 |
| 4,414,637 | 11/1983 | Stanley | 328/63 |
| 4,475,085 | 10/1984 | Yahata et al. | 328/62 |
| 4,485,479 | 11/1984 | Iino et al. | 328/60 |
| 4,510,451 | 4/1985 | Lungmire et al. | 328/60 |

Primary Examiner—John S. Heyman
Attorney, Agent, or Firm—Staas & Halsey

[57] ABSTRACT

When a trigger clock is input, its leading and trailing edges are detected, and first and second oscillators are started to oscillate by the leading and trailing edge detected outputs, respectively. The first and second oscillators oscillate at the same oscillation frequency, which is determined by data set in period setting means. A flip-flop is set by the output of the first oscillator and reset by the output of the second oscillator and the flip-flop output is provided as multi-clock pulses. The number of multi-clock pulses from the flip-flop is counted by a clock counter, and when it is detected by a stop detector that the clock counter has counted to a preset value, the first and second oscillators are stopped, by the detected output, from oscillation.

17 Claims, 11 Drawing Figures

MULTI-CLOCK GENERATOR

BACKGROUND OF THE INVENTION

The present invention relates to a multi-clock generator which is used in test equipment for logic ICs such as a microcomputer and which generates a preset number of clock pulses (multi-clock pulses) upon each input of a trigger clock.

In conventional IC test equipment for testing, for example, a semiconductor memory, one input data and one expected value data are generated for each clock from a timing generator and the input data is applied to an IC element under test, whose output is compared with the expected value data. That is, according to the prior art, one clock, one input data and one expected value data are generated for each test cycle which is commonly referred to as a rate. A series of such test patterns are prestored at successive addresses of a pattern memory, which is read out by advancing the address for each clock.

A logic circuit such as a microcomputer could also be tested by reading out a test pattern from the pattern memory in the same manner as described above. In the case of the microcomputer, it often happens that test data is subjected to a plurality of processing steps in the microcomputer, providing output data. In order to perform the plurality of processing steps in a sequential order, it is necessary to supply clocks of the same number as the steps one after another from the outside. Accordingly, in the pattern memory are stored the clocks at respective addresses and, at the same time, input data is stored at a certain address and expected value data is stored at an address spaced apart therefrom by the number of steps necessary for processing the input data. This inevitably increases the number of addresses of the pattern memory at which only the clocks are stored, resulting in an inefficient use of the pattern memory.

SUMMARY OF THE INVENTION

An object of the present invention is to provide a multi-clock generator which is employed, for example, for testing logic ICs and which, for each rate, generates a preset number of so-called multi-clock pulses, thereby permitting an efficient use of the pattern memory, for instance.

According to the present invention, when a trigger clock is input, its leading and trailing edges are detected, and a first oscillator starts oscillation at the leading edge detected timing and a second oscillator starts oscillation at the same oscillation frequency as the first oscillator at the trailing edge detected timing. The oscillation outputs of the first and second oscillators are applied to a flip-flop to control it, producing multi-clock pulses each having a leading edge determined by the oscillation output of one of the oscillators and a trailing edge determined by the oscillation output of the other. The number of multi-clock pulses is counted by a clock counter, and when it is detected by stop detecting means that the clock counter has counted to a preset number of multi-clock pulses, the first and second oscillators are stopped from oscillation. In this way, multi-clock pulses of the same number as the preset number of clocks are produced upon each occurrence of the trigger pulse. In this case, the first and second oscillators are arranged so that they oscillate at the same frequency which can be set from the outside; namely, the same set frequency data can be used for oscillation of these oscillators.

DESCRIPTION OF THE PREFERRED EMBODIMENTS

Figure 1:
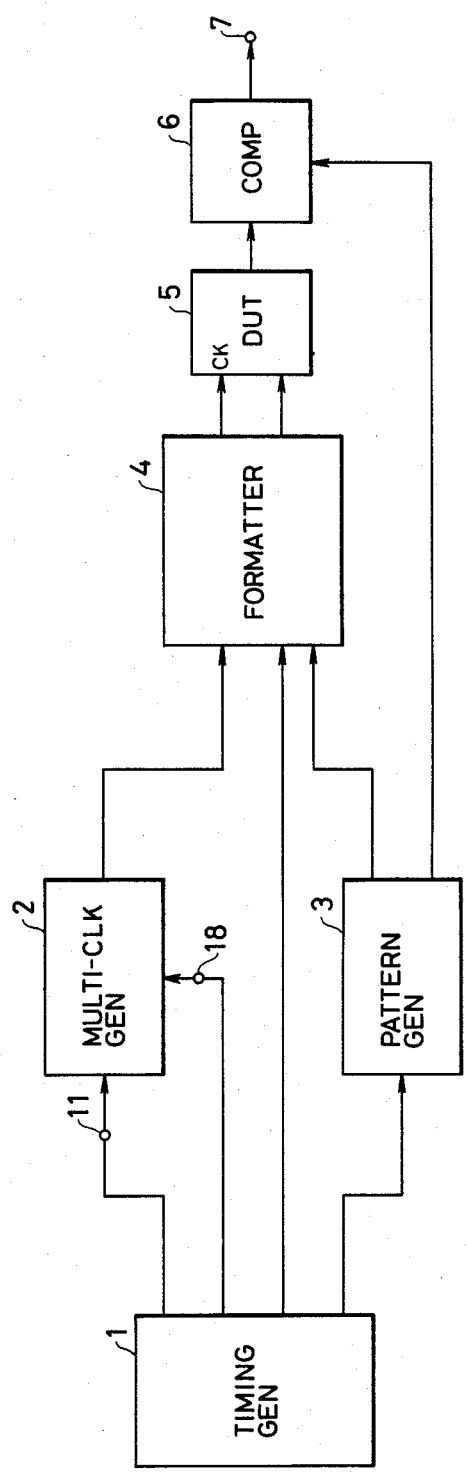
FIG. 1 is a block diagram illustrating logic circuit test equipment to which the multi-clock generator of the present invention is applied.

A description will be given, with reference to FIG. 1, of logic circuit test equipment to which the multi-clock generator of the present invention is applied. A clock (a trigger clock) of a set pulse width W is output from a timing generator 1 with a set period, and supplied to an input terminal 11 of a multi-clock generator 2 of the present invention. Upon each generation of the trigger clock, the timing generator 1 also provides a clock to a pattern generator 3 at proper timing, generating a test pattern for each clock. For each application thereto of the trigger clock, the multi-clock generator 2 yields a preset number of clocks (multi-clock pulses) with a preset period, which are supplied via a formatter 4 to a clock input terminal of a logic circuit 5 under test, such as a microcomputer. Input data in the test pattern from the pattern generator 3 is rendered into a logic waveform set by the formatter 4 and, at the same time, it is given a preset level, thereafter being provided to the logic circuit 5 under test. The input data to the logic circuit 5 under test is processed therein in synchronism with the multi-clock pulses applied thereto, thereafter being output therefrom. The results of processing are compared by a comparator 6 with expected value data in an output test pattern of the pattern generator 3, and the results of comparison are provided, as the test results, to an output terminal 7.

Figure 2:
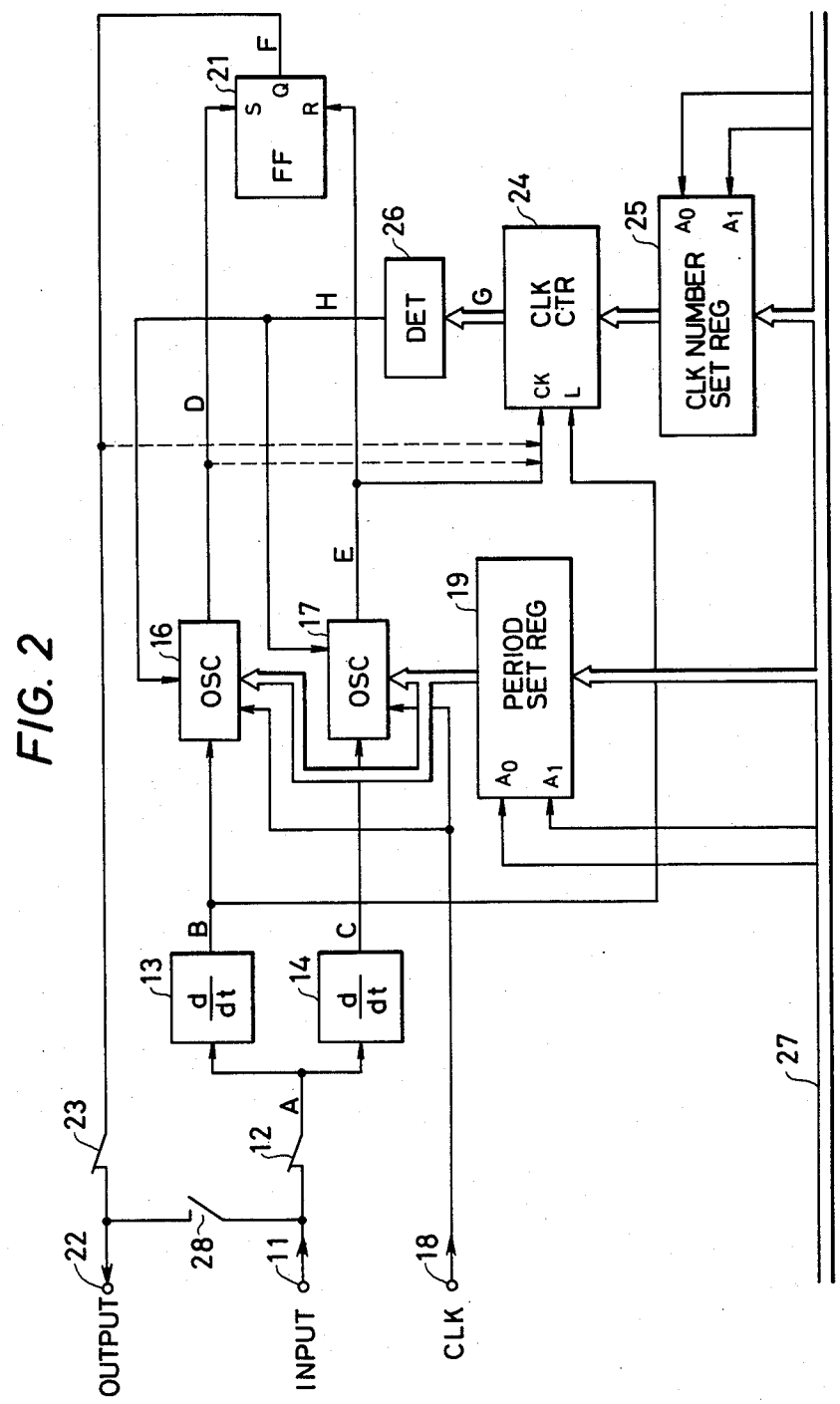
FIG. 2 is a block diagram illustrating an example of the multi-clock generator of the present invention.

FIG. 2 illustrates in block form an example of the multi-clock generator 2 of the present invention. From the input terminal 11 is applied the trigger clock, which is the clock that is conventionally produced, for each rate, from the timing generator 1 (FIG. 1), for example, in an IC test equipment. This trigger clock is provided via a switch 12, as required, to a leading edge detecting differentiation circuit 13 and a trailing edge detecting differentiation circuit 14, wherein it is differentiated, producing pulses of the same timings as the leading and trailing edges of the trigger clock.

The outputs from these differentiation circuits 13 and 14 are respectively provided to oscillators 16 and 17, starting them to oscillate. The oscillators 16 and 17 are each supplied with a reference clock from the timing generator 1 via a terminal 18 and, using the reference clock as a reference of their oscillation period, they oscillate with the same period corresponding to period data which is provided to a period setting register 19 via a bus 27. The oscillation outputs of the oscillators 16 and 17 are applied to an RS flip-flop 21, which is set by the output of the one oscillator 16 and reset by the output of the other oscillator 17, producing output pulses each having the leading edge determined by the former output and the trailing edge determined by the latter output. The output pulses of the flip-flop 21 are provided as multi-clock pulses to a terminal 22 via a switch 23, as required.

The number of multi-clock pulses available from the flip-flop 21 is counted by a clock counter 24. To this end, the number of outputs from the oscillator 17 which determines the trailing edge of each of the multi-clock pulses is counted by the clock counter 24. When the count value of the counter 24 has reached a value set in a clock number setting register 25, the end of count is detected by a stop detector 26 and its detected output stops the oscillators 16 and 17 from oscillation.

For example, when a trigger clock TC is applied to the input terminal 11, as shown in FIG. 3A, the leading edge of the trigger clock TC is detected by the differentiation circuit 13 to produce a pulse of the timing corresponding to the leading edge of the trigger pulse TC, as shown in FIG. 3B, and the trailing edge of the trigger clock TC is detected by the differential circuit 14 to produce a pulse of the timing corresponding to the trailing edge of the trigger clock TC, as depicted in FIG. 3C. The output pulse of the differentiation circuit 13 is provided as a starting pulse to the oscillator 16 to cause it to start oscillation at a frequency corresponding to the period data set by the period setting register 19, generating such pulses as shown in FIG. 3D. Similarly, the oscillator 17 is caused by the output pulse of the differentiation circuit 14 to start oscillation, as depicted in FIG. 3E. The oscillation periods (frequencies) D+W of these oscillators 16 and 17 are the same and their phases of oscillation are displaced apart only by the pulse width W of the trigger clock TC.

Figure 3:
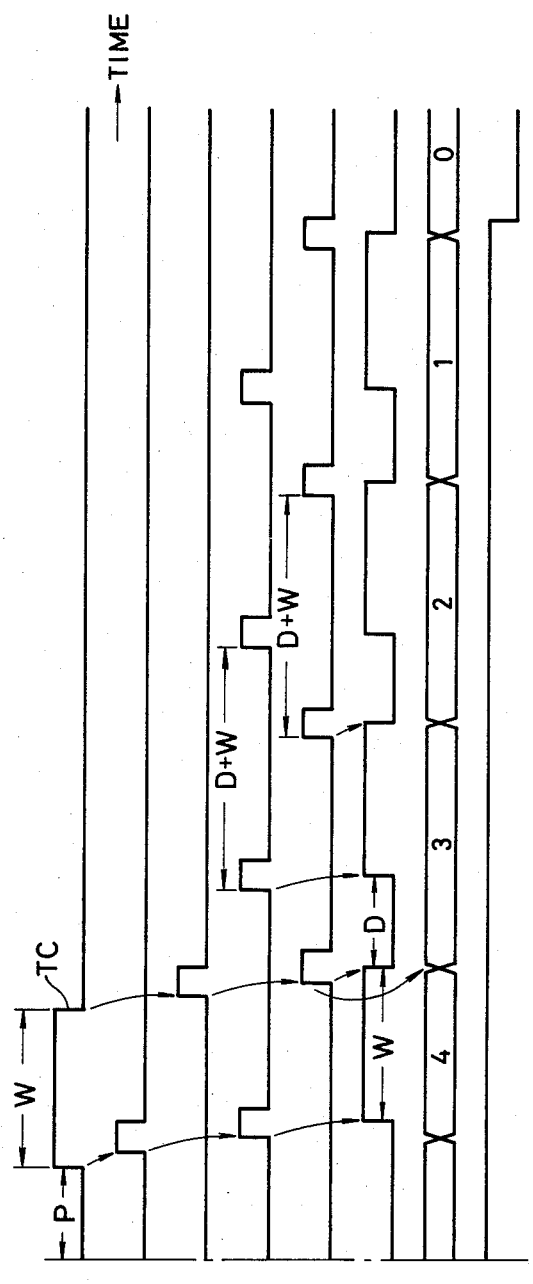
FIGS. 3A through 3H are timing charts showing, by way of example, waveforms occurring at respective parts of the multi-clock generator during its operation.

Being set by the output of the oscillator 16 and reset by the output of the oscillator 17, the flip-flop 21 produces multi-clock pulses of the same width as the pulse width W of the trigger clock TC and of the same period as the oscillation period D+W of the oscillators 16 and 17, as shown in FIG. 3F, and these pulses are provided to the terminal 22. The clock counter 24 is constituted as a down counter in this example. The content of the clock number setting register 25 is preset by the output pulse of the differentiation circuit 13 into the clock counter 24; for instance, in the example of FIG. 3, a set number "4" is preset, as shown in FIG. 3G. The counter 24 counts down the output pulses of the oscillator 17, and hence is decremented for each pulse, as depicted in FIG. 3G. When the multi-clock pulses have been output by the preset number indicated by the register 25, that is, when four output pulses have been yielded in this example, the counter 24 goes to zero. This is detected by the stop detector 26 and its detected output drops from the high to the low level, as shown in FIG. 3H.

By the fall of the output from the stop detector 26 to the low level, the oscillators 16 and 17 are stopped from oscillating. In this way, upon each application of the trigger clock from the input terminal 11, four multi-clock pulses are provided at the output terminal 22 in this example. While only one trigger clock is produced for each rate, four multi-clock pulses can be generated for each rate, and in addition, the number of multi-clock pulses can freely be selected by changing the number of clocks which is preset by the clock number setting register 25 in the counter 24.

Incidentally, this example is designed so that the period data and the number of clocks can be set in the registers 19 and 25 via the data bus 27 from a controller not shown and that in the setting of them, one of four register parts of each of the registers 19 and 25 can be selected by means of addressing. In this case, an address "$A_0A_1$" is provided to the registers 19 and 25 using, for example, two lines (two bits) in the data bus 27 and data is entered into the register 19 or 20 using the remaining lines in the data bus 27. When the number of digits of data to be set is large, the data is set using the data bus 27 a plurality of times. By presetting four kinds of data in the registers 19 and 25 as described above and by changing the address "$A_0A_1$" on a real-time basis during operation, it is possible to select one of the four kinds of data, varying the number and the frequency of multi-clock pulses to be generated.

As will be seen from FIG. 3, the pulse width W of the multi-clock pulses to be produced is equal to the pulse width W of the input trigger clock TC, that is, the ON-time period or the duration of the multi-clock pulses is equal to the pulse width W of the input clock and their OFF-time period is equal to the value D resulting from subtraction of the pulse width W from the oscillation period of the oscillators 16 and 17. Accordingly, an increase in the oscillation period of the oscillators 16 and 17 causes an increase in the OFF-time period D and a decrease in the oscillation period decreases the OFF-time period. The ON-time period W is controlled by changing the pulse width W of the trigger clock TC, and this is effected by the timing generator 1 (FIG. 1) which provides the trigger clock to the input terminal 11. The phase P (FIG. 3A) from the initiation of one rate to the generation of the trigger clock TC is also controllable by the timing generator 1. The means for changing the pulse width W and the phase P is provided in the conventional timing generator 1. In the case of producing no multi-clock pulses, it is necessary only to hold the switches 12 and 23 in the OFF state and a switch 28 in the ON state in FIG. 2, thus directly supplying the trigger clock from the input terminal 11 to the output terminal 22.

Figure 4:
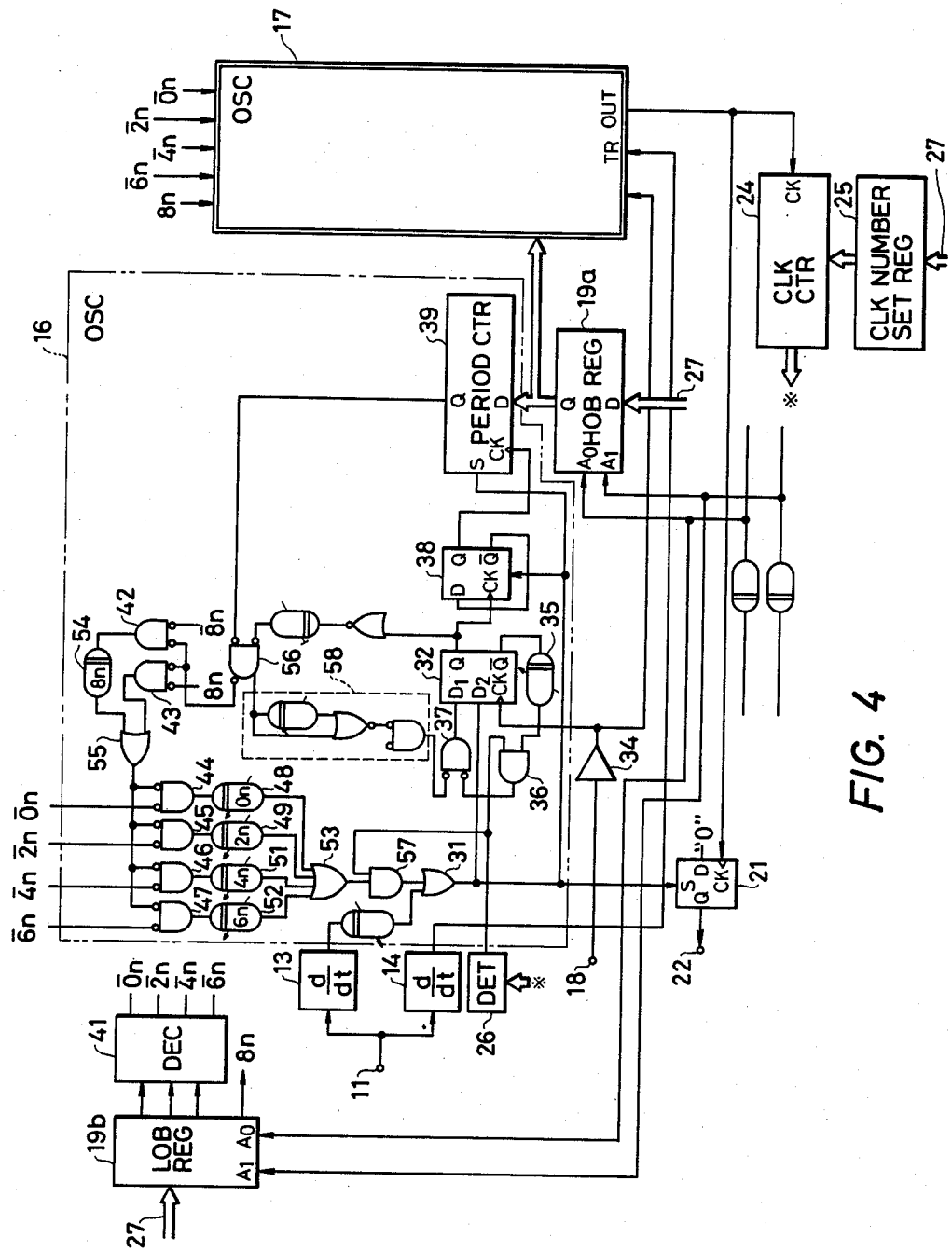
FIG. 4 is a logic circuit diagram illustrating a specific example of a first oscillator 16 used in FIG. 2.

In this example, the oscillators 16 and 17 have their oscillation frequencies determined by the same preset period data and are identical in construction with each other. The oscillator 16 is arranged, for example, as shown in FIG. 4. When the output pulse of the differentiation circuit 13 is provided via an OR gate 31 to a data terminal $D_2$ of a D flip-flop 32, since a reference clock of, for instance, 500 MHz, from the clock terminal 18 is being applied via an amplifier 34 to a clock terminal of the D flip-flop 32, its $\bar{Q}$ output goes down to the low level and is fed, as a high-level signal, back to a data terminal $D_1$ via a delay circuit 35 and AND circuits 36 and 37. Prior to the above feedback, however, the low level resulting from the fall of the output pulse from the differentiation circuit 13 is read into the flip-flop 32 and its $\bar{Q}$ output goes up to the high level. Assuming that the time until the abovesaid high level is fed back to the data terminal $D_1$ is, for example, 8 ns, an oscillation of an 8 ns period is provided by the feedback loop including the flip-flop 32 and the delay circuit 35.

The oscillation output of the 8 ns period is supplied to a flip-flop 38, wherein it is frequency divided down to $\frac{1}{2}$, producing an output of a 16 ns period. The 16 ns output is counted by a period counter 39. In this example, the period counter 39 is also formed as a down counter. Upon occurrence of the output pulse from the differentiation circuit 13, it is provided via the OR circuit 31 to a preset terminal of the period counter 39, setting the high-order bit portion in the period setting register 19 comprised of a high order bit register 19a and a low order bit register 19b, into the period counter 39. In other words, that portion of the period data set in the period setting register 19 which has a weight greater in unit than 16 ns is set into the period counter 39 from the register 19a of the period setting register 19, and that portion of the period data which has a weight smaller in unit than 16 ns is provided to a decoder 41 from the register 19b of the period setting register 19.

This example is arranged to permit setting the oscillation period W+D with an accuracy of 2 ns. The register 19b outputs 4-bit data, and three of the four bits, weighted 1 ns, 2 ns and 4 ns, are applied to the decoder 41 and the bit weighted 8 ns is provided to gates 42 and 43, enabling either one of them. The decoder 41 provides, according to the contents of the inputs thereto, a high level at one of its four output terminals, and the outputs at the four output terminals are provided to gates 44, 45, 46 and 47, respectively. The outputs of the gates 44, 45, 46 and 47 are supplied to an OR gate 53 via 0 ns, 2 ns, 4 ns and 6 ns delay circuits 48, 49, 51 and 52, respectively. The output of the gate 42 is provided via an 8 ns delay circuit 54 to an OR gate 55 and the output of the gate 43 is applied directly to the OR gate 55, the output of which is supplied to the gates 44 to 47.

The high-order data of the period data in the period setting register 19 is preset in the period counter 39 from the register 19a, and the count value of the counter 39 is decremented one by one upon each application of the output pulse from the flip-flop 38. When the value of the period counter 39 goes down to zero, its output becomes low-level and is applied to a gate 56. In the case where the data smaller than 16 ns in the period setting register 19 is 0, the output of the gate 56 is provided to the data terminal $D_2$ of the flip-flop 32 via the gates 43, 55 and 44, the delay circuit 48, the OR gate 53, an AND gate 57 and the OR gate 31, starting oscillation again. The flip-flop 32, the delay circuit 35 and the gates 36 and 37 start oscillation upon each occurrence of the output from the OR gate 31 and produce, in synchronism with the reference clock from the clock terminal 18, an oscillation output with a period longer than the reference clock, and the oscillation is stopped by the output from the clock counter 26 or the period counter 39.

In the case where the data set in the period setting register 19 is smaller than 8 ns, the output of the counter 39 is applied to the OR gate 55 via the gates 56 and 43. When the data is, for example, 4 ns, only the gate 46 is enabled, through which the output of the gate 55 is applied to the delay circuit 51, wherein it is delayed for 4 ns, thereafter being provided to the OR gate 53. When the data smaller than 16 ns in the period setting register 19 is in the range of 8 ns to 16 ns, the output of the gate 56 is provided to the gates 44 to 47 via the gate 42, the delay circuit 54 and the OR gate 55. The 8 ns delay by the delay circuit 54 and the delay by any one of the delay circuits 48 to 52 are added together, and the output of the gate 56 is delayed for a period of time equal to the sum of the delays and is applied to the OR gate 53.

In this way, the oscillation period can be set with an accuracy of 2 ns. Incidentally, upon each generation of the output from the period counter 39, the output of the gate 56 is applied to an oscillation stop circuit 58 as well. The gate 56 is being supplied at the other input with a Q output from the flip-flop 32, and upon each occurrence of the output of the period counter 39, the high level is applied via the oscillation stop circuit 58 to the gate 37 to inhibit it, stopping the oscillation of the flip-flop 32 through the delay circuit 35. When supplied at the data terminal $D_2$ with the output from the OR gate 31, the flip-flop 32 resumes oscillation. The inputs to the data terminals $D_1$ and $D_2$ of the flip-flop 32 are ORed therein with each other. The oscillator 17 is supplied with the outputs of the register 19a and the decoder 41 and the bit indicative of 8 ns from the register 19b.

In this example, the output of the OR gate 31 is applied to a set terminal of the D flip-flop 21 to set it, making its Q output high-level. A clock terminal of the D flip-flop 21 is driven by the output of the oscillator 17 to read therein the low level "0" provided at its data terminal D, resetting the flip-flop 21. When the clock counter 24 has counted to the preset number of clocks, the output of the stop detector 26 becomes low-level, disabling the gates 36 and 57. When the number of clocks has been preset in the counter 24 by the application of the trigger clock to the input terminal 11, the output of the stop detector 26 becomes high-level to enable the gates 36 and 57, thus permitting oscillation.

Since control is made to stop the oscillation after generating a preset number of multi-clock pulses, the purpose can be attained not only by counting the output pulses from the oscillator 17 but also by directly counting the output pulses from the flip-flop 21 or the output pulses from the oscillator 16 as indicated by broken lines in FIG. 2. From the standpoint of stopping the oscillation when the number of output multi-clock pulses has just reached a predetermined value, however, counting of the output from the oscillator 17 which determines the trailing edge of the multi-clock pulse, or the output from the flip-flop 21, will allow more ease in the circuit design. That is, in the case of stopping the oscillation after counting the output pulses from the oscillator 16, it is necessary to wait for the generation of one output pulse from the oscillator 17 after counting the preset number of output pulses from the oscillator 16. When the pulse width of the trigger clock is fixed, the circuit design is easy, but in the case where the pulse width varies, a somewhat complex circuit arrangement is required.

As has been described above, it is possible with the multi-clock generator of the present invention to generate a preset number of multi-clock pulses upon each application of the trigger clock. Accordingly, when the multi-clock generator of the present invention is applied, for example, to logic circuit element test equipment, input data and expected value data are prestored in a test pattern memory at respective addresses thereof, and these data are read out one after another for each rate and the multi-clock pulses are produced for each rate; thus, the pattern memory can be utilized effectively.

Further, since the multi-clock generator of the present invention employs two oscillators and oscillates them at the same frequency, their oscillation frequencies can be set using the same data. This data setting is utilized for alteration of the oscillation period W+D and for setting of the OFF-time period D, and consequently, the number of data to be set is small by that.

In the above-described embodiment, clock number data and period data are respectively prepared in a plurality of sets of setting registers, and by selectively using them on a real-time basis, various multi-clock pulses can be generated.

The setting of the number of clocks is not limited specifically to the case of using a down counter as mentioned previously. It is also possible to make such an arrangement that the detector 26 yields an output when the count value of an up counter used as the clock counter 24 reaches a preset value, or that the difference between the maximum count value of the counter 24 and the clock number to be set is preset and when the counter 24, which counts from the preset value upward, overflows, the oscillation is stopped. Also it is possible to similarly detect the counting of a value corresponding to set period data by using an up counter as the period counter 39. Moreover, the multi-clock generator of the present invention can be used for generating multi-clock pulses not only in response to periodically input trigger clocks but also in response to aperiodically input trigger clocks or a single shot of a trigger clock.

In the embodiment shown in FIG. 4, the oscillation period may also be determined using only the period counter 39. With such an arrangement as shown in FIG. 4 intended for fine control of the oscillation period over a wide range, the period counter 39 need not be so high-speed and the number of its counting stages can also be decreased, thus reducing the manufacturing costs of the equipment. When the period of the multi-clock is constant, the period setting portion can be omitted.

It will be apparent that many modifications and variations may be effected without departing from the scope of the novel concepts of the present invention.

What is claimed is:

1. A multi-clock generator comprising:
   leading edge detector means for detecting the leading edge of an input trigger clock;
   trailing edge detector means for detecting the trailing edge of the input trigger clock;
   first oscillator means, responsive to the detected output from the leading edge detector means to start oscillation, for providing respective output pulses;
   second oscillator means responsive to the output from the trailing edge detector means to start oscillation with the same frequency as that of the first oscillator means, for providing respective output pulses;
   a flip-flop supplied with the outputs from the first and second oscillator means to be set by one of them and reset by the other, for producing multi-clock pulses as a respective output;
   a clock counter for counting the number of said pulses from a predetermined one of said first and second oscillation means and said flip-flop;
   clock number setting means for setting therein data corresponding to a predetermined number of said pulses to be counted by said clock counter; and
   stop detecting means for providing an output for stopping the first and second oscillator means from oscillation upon detecting that the clock counter has counted said predetermined number of said pulses.

2. A multi-clock generator according to claim 1 which further comprises period setting means for setting therein data corresponding to the oscillation period of the first and second oscillator means, and wherein the first and second oscillator means are so arranged as to oscillate at an oscillation frequency determined by the data set in the period setting means.

3. A multi-clock grnerator according to claim 2 wherein:
   a reference clock is supplied to said first and second oscillator means;
   the first and second oscillator means are each provided with a period counter and a count detecting means;
   each said period counter responds to the input trigger clock to start counting the number of said reference clocks;
   when it is detected by each said count detecting means that the respective period counter has counted to a value corresponding to the data set in the period setting means, the period counter is caused by the detected output of the respective count detecting means to repeat the counting operation, for the subsequent oscillation, starting from a predetermined value; and
   the period counter is stopped, by the output of the stop detecting means, from continuing the repetitive counting operation.

4. A multi-clock generator according to claim 3 wherein:
   each said first and second oscillator means includes a delay means;
   when it is detected by one of said count detecting means that the respective period counter has counted to a value corresponding to a high-order bit value of the data set in the period setting means, the period counter is stopped, by the output of the respective count detecting means, from counting;
   the detected output of the respective count detecting means is delayed by the respective delay means for a period of time corresponding to a low-order bit value of the data set in the period setting means; and
   the period counter is caused by the delayed output to resume counting from a predetermined value.

5. A multi-clock generator according to claim 4 wherein:
   each of the first and second oscillator means comprises a clock terminal for receiving the reference clocks, an oscillation circuit provided between the respective clock terminal and the respective period counter, and a respective delay means;
   when supplied with the output of the respective leading and the trailing edge detector means, or the output of the respective first delay means, the respective first and second oscillator means starts said oscillation to supply the respective period counter with pulses synchronized with the reference clocks but having a period longer than that of the reference clocks; and
   said oscillation is stopped, by the respective output of the count detecting means, thus stopping the counting operation of the respective period counter.

6. A multi-clock generator according to claim 5 wherein each said delay means include a plurality of delay circuits of different delay times and means for selecting one of them in accordance with the low-order bit value of the data set in the period setting means, for permitting passage therethrough of the output of the count detecting means.

7. A multi-clock generator according to any one of claims 3 to 6 wherein:
   the clock number setting means and the period setting means include means for setting a plurality of different clock number data and period data, respectively; and said clock number data and period data are selectively provided to said clock counter and both said period counters, respectively.

8. A multi-clock generator according to any of claims 2 to 6 wherein the clock counter is an up or down counter and has preset therein the clock number data from the clock number setting means by the detected output of the leading edge detector means, and wherein the stop detecting means detects a respective carry-up or carry-down output of the clock counter.

9. A multi-clock generator according to any one of claims 4 to 6 wherein each said period counter is an up or down counter, wherein the high-order bit value of the data set in the period setting means is preset in each said period counter by the output of respective one of the first and second oscillator means and the respective delay means, and wherein each respective count detecting means detects a carry-up or carry down output of the respective period counter.

10. A multi-clock generator according to any one of claims 1 to 6 wherein the clock counter counts the number of said multi-clock pulses output from the flip-flop.

11. A multi-clock generator according to any one of claims 1 to 6 wherein the clock counter counts the number of said output pulses of the second oscillator means.

12. A multi-clock generator according to any one of claims 1 to 6 wherein the clock counter counts the number of said output pulses of the first oscillator means.

13. An apparatus for testing logic integrated circuits, comprising:
   a timing generator for selectively outputting a trigger clock of a predetermined pulse width, and for outputting a reference clock of period greater than said predetermined pulse width;
   a pattern generator for storing test patterns to be successively supplied for said testing in correspondence with each said trigger clock; and
   a multi-clock generator for outputting a respective predetermined number of multi-clock pulses, in correspondence to said reference clock, upon each occurrence of said trigger clock;
   wherein for each said trigger clock, corresponding to each of respective successive ones of said test patterns, a respective predetermined number of said multi-clock pulses are supplied for said testing.

14. The apparatus of claim 13, comprising means for selectively changing said predetermined pulse width.

15. The apparatus of claim 13 or 14, each said multi-clock pulse having a width equal to said predetermined pulse width of said trigger clock.

16. A test pattern generator comprising:
   means for supplying a succession of test patterns to a device to be tested;
   means for successively inputting trigger clocks of a predetermined width corresponding to respective ones of said test pattern;
   means for setting data specifying a respective predetermined number of multi-clock pulses for each said trigger clock; and
   means for successively outputting said predetermined numbers of multi-clock pulses of said predetermined width, between said respective ones of said test patterns.

17. The generator of claim 16, comprising means for changing said predetermined width.

* * * * *